US009519026B2

(12) United States Patent
Li et al.

(10) Patent No.: US 9,519,026 B2
(45) Date of Patent: Dec. 13, 2016

(54) COMPRESSED SCAN TESTING TECHNIQUES

(71) Applicant: Apple Inc., Cupertino, CA (US)

(72) Inventors: Bibo Li, San Jose, CA (US); Andrew J. Copperhall, Redwood City, CA (US); Bo Yang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 134 days.

(21) Appl. No.: 14/502,284

(22) Filed: Sep. 30, 2014

(65) Prior Publication Data

US 2016/0091564 A1 Mar. 31, 2016

(51) Int. Cl.
*G01R 31/28* (2006.01)
*G01R 31/3185* (2006.01)

(52) U.S. Cl.
CPC ........... *G01R 31/318566* (2013.01); *G01R 31/318544* (2013.01)

(58) Field of Classification Search
None
See application file for complete search history.

(56) References Cited

U.S. PATENT DOCUMENTS

| 7,865,794 | B2 | 1/2011 | Rajski et al. |
| 7,900,104 | B2 | 3/2011 | Rajski et al. |
| 8,214,170 | B2 | 7/2012 | Crosby et al. |
| 8,413,102 | B2 * | 4/2013 | Yang .................. G06F 17/5081 716/133 |
| 8,700,962 | B2 | 4/2014 | Tekumalla et al. |
| 2004/0246337 | A1 * | 12/2004 | Hasegawa ...... G01R 31/318536 348/189 |
| 2006/0095818 | A1 * | 5/2006 | Bratt .............. G01R 31/318547 714/726 |
| 2010/0083199 | A1 * | 4/2010 | Wohl ............. G01R 31/318547 716/136 |
| 2011/0307750 | A1 * | 12/2011 | Narayanan ..... G01R 31/318547 714/729 |
| 2012/0217989 | A1 * | 8/2012 | Sinanoglu .......... H03K 19/0008 326/16 |
| 2014/0281777 | A1 * | 9/2014 | Bhattacharya ... G01R 31/31854 714/729 |

OTHER PUBLICATIONS

DFTMAX High Quality, Low Cost Test (Datasheet), Synopsys, Inc, 2013, 4 pages.

* cited by examiner

*Primary Examiner* — Daniel McMahon
(74) *Attorney, Agent, or Firm* — Meyertons, Hood, Kivlin, Kowert & Goetzel, P.C.

(57) ABSTRACT

Techniques are disclosed relating to test equipment. In one embodiment, a method includes receiving failure information from a first test of a device under test (DUT). In this embodiment, the DUT includes a plurality of scan chains that each include a plurality of scan cells. In this embodiment, the first test is based on a first compressed test pattern. In this embodiment, the failure information does not permit a definitive determination as to which scan cell is a failing scan cell. In this embodiment, the method includes generating a plurality of compressed test patterns based on the first compressed test pattern. In this embodiment, the plurality of compressed test patterns specify one-to-one-modes. In this embodiment, the method includes performing one or more second tests of the DUT using the plurality of compressed test patterns to definitively determine one or more failing scan cells.

20 Claims, 5 Drawing Sheets

COMPRESSED SCAN TESTING TECHNIQUES

BACKGROUND

1. Technical Field

This disclosure relates generally to test equipment and more specifically to compressed scan testing.

2. Description of the Related Art

Scan-based design-for-test (DFT) techniques are often used to facilitate circuit testing, e.g., to detect manufacturing defects. In scan-based design, circuitry (e.g., flip-flops or latches) in a device under test (DUT) is coupled to one or more scan chains which are used to gain access to internal nodes. Test patterns are shifted in via the scan chains, functional clock signals are pulsed to the circuitry during "capture" cycles, and results are shifted to output pins and compared to expected results.

Automatic test equipment is often used to test circuitry using scan-based techniques. Decreasing testing time and/or increasing test accuracy may decrease product costs and result in competitive advantages in various industries. However, scan-based techniques often involve long input patterns which may increase testing time and/or require a large number of input/output pins. Test compression techniques may be used in which a compressed input pattern is provided to a smaller number of input pins (than the number of scan chains), then decompressed and provided to internal scan chains. Outputs of the scan chains are then compacted and provided via a smaller number of output pins. Test compression may reduce testing times and the number of required input/output pins, especially for tests in which a relatively small number of scan cells need to take specific values. However, unknown design values (typically represented using an 'X') may cause difficulty in definitively determining the scan cell causing a particular failure, e.g., because the outputs of multiple scan chains may be XOR'd when compacted. This phenomenon is often referred to as "X-masking."

SUMMARY

Techniques are disclosed relating to test equipment. In one embodiment, a method includes receiving failure information from a first test of a device under test (DUT). The test may be performed using automatic test equipment (ATE). In this embodiment, the DUT includes a plurality of scan chains that each include a plurality of scan cells. In this embodiment, the first test is based on a first compressed test pattern. In this embodiment, the method further includes determining that the failure information is usable to identify a group of scan cells as scan cells that have potentially failed the first test, but does not permit a definitive determination as to whether a scan cell in the group is a failing scan cell. In this embodiment, the method includes generating a plurality of compressed test patterns based on the first compressed test pattern. In this embodiment, the plurality of compressed test patterns specify one-to-one-modes. In this embodiment, the method includes performing one or more second tests of the DUT using the ATE and the plurality of compressed test patterns. In this embodiment, the method includes definitively determining one or more scan cells in the group as failing scan cells based on failure information from the second one or more tests. In some embodiments, the determining and the definitively determining are based on design information and/or pattern compilation information.

In one embodiment, a system includes a failure processing unit configured to receive failure information from a first test of a device under test (DUT), where the DUT includes a plurality of scan chains that each include a plurality of scan cells. In this embodiment, the first test is performed using a first compressed test pattern. In this embodiment, the failure processing unit is configured to determine that the failure information is not usable to definitively determine a failing scan cell for a failure. In this embodiment, the failure processing unit is configured to generate a plurality of compressed test patterns based on the first test pattern, such that the plurality of compressed test patterns specify different test modes in which an output of at least one of the plurality of scan chains is directly coupled to a scan output. In this embodiment, the failure processing unit is configured to definitively determine the failing scan cell for the failure based on one or more second tests of the DUT using the plurality of compressed scan patterns. In some embodiments, the system includes automatic test equipment (ATE) configured to perform the first test and the one or more second tests. In some embodiments, the system includes a compiler unit, a simulation unit, and/or an automatic test pattern generator.

In some embodiments, the disclosed techniques may reduce testing times and/or increase the ability to definitively map test failures to failing scan cells.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component.

DETAILED DESCRIPTION

Figure 1:
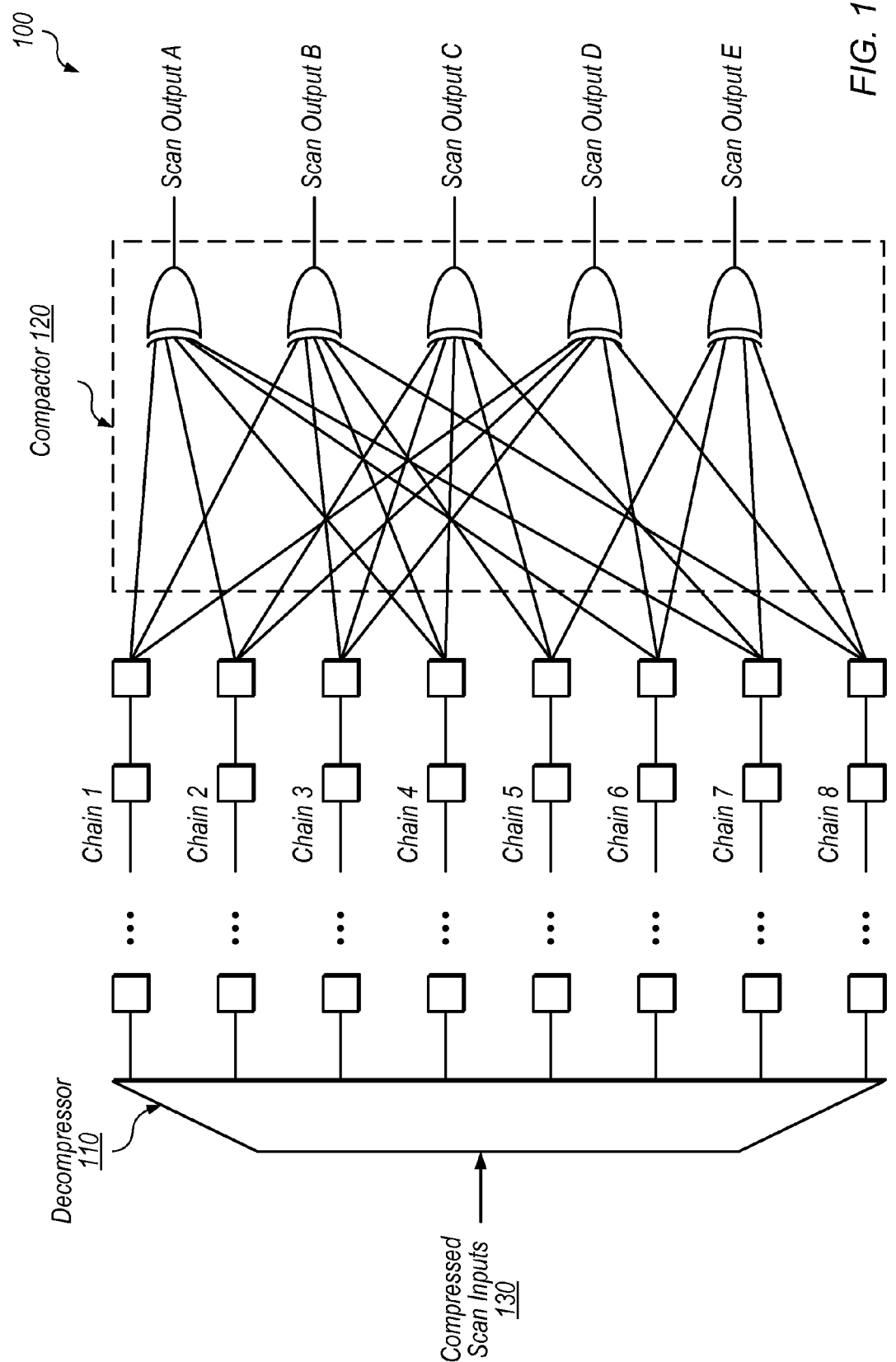
FIG. 1 is a block diagram illustrating one embodiment of a compressed scan system.

This disclosure initially describes, with reference to FIG. 1, an overview of a compressed scan system. Embodiments of methods for processing failure information and definitively determining failing scan cells are disclosed with reference to FIGS. 2-4. FIG. 5 illustrates an exemplary embodiment of compressed scan circuitry configured to implement a plurality of one-to-one modes. In some embodiments, the techniques disclosed herein may significantly reduce testing time and/or allow definitive determination of failing scan cells in the presence of unknown (X) design values.

Compressed Scan Processing Overview

In scan-based design, circuitry (e.g., flip-flops or latches) in a device under test (DUT) is coupled to one or more scan chains which are used to gain access to internal nodes. Test patterns are shifted in via the scan chains, functional clock signals are pulsed to the circuitry during capture cycles, and results are shifted to output pins and compared to expected results. In uncompressed scan techniques, each scan chain is typically coupled to a single scan input and single scan output, allowing a failure to be easily mapped to a particular scan cell (e.g., based on the number of shifts before the failing result is read on a scan output). However, for compressed scanning techniques, mapping a failure (e.g., from a failure log) to a particular scan cell may be more difficult.

FIG. 1 shows a block diagram illustrating one embodiment of a compressed scan system 100. In the illustrated embodiment, system 100 is configured to receive compressed scan inputs 130, expand the inputs using decompressor 110, provide the expanded inputs to multiple different scan chains (chains 1-8), and compact the outputs of the scan chains using compactor 120 to generate multiple scan outputs (scan outputs A-E). In various embodiments, system 100 may include any of various numbers of input pins, scan chains, and/or scan outputs. As shown, test compression implemented by system 100 may result in a smaller number of input/output pins than internal scan chains. In some embodiments, system 100 is included in a DUT and compressed scan inputs 130 and scan outputs A-E are pins on the DUT.

In the illustrated embodiment, compactor 120 is configured to provide the output of each scan chain to three exclusive-or (XOR) circuits. For example, the output of scan chain 1 is coupled to the XOR circuits for scan outputs A, B, and D while the output of scan chain 5 is coupled to the XOR circuits for scan outputs B, C, and E. Further, multiple scan chain outputs are compacted into each scan output in the illustrated embodiment. For example, the XOR circuitry for scan output A receives the outputs of scan chains 1, 2, 4, 6, and 7. In other embodiments, various numbers of XOR gates having any of various appropriate numbers of inputs may be implemented in compactor 120.

Often, when an unexpected scan output is received, a failure can be deterministically mapped to a specific chain based on other ones of scan outputs A-E and the configuration of compactor 120. However, unknown values (X) in the design (e.g., from non-scan cells, analog cells, timing violating paths, etc.) may make this mapping more difficult. Consider, for example, an X from scan chain 1 in a particular shift cycle. In that cycle, scan outputs A, B, and D are all X-masked such that a detected failure could be the result of several different scan chains.

Different techniques have been used in attempting to improve compressed scan testing. As a first example, setup issues may be debugged and cleaned using uncompressed scan patterns. However, this may only help during initial pattern bring-up. Further, even during initial pattern bring-up, compressed patterns may have failures that do not occur in uncompressed mode as the stimulus in patterns are different. Also, the compressed/uncompressed environments may be substantially different in terms of voltage characteristics (e.g., instantaneous voltage drop stresses). As a second example, a vendor automatic test pattern generator (ATPG) tool may be used to map failures. However, this may take considerable time (e.g., while the tool processes the DUT design) and may require calibration to find a correct shift offset. Also, because of X-masking, the ATPG tool may not be able to deterministically map a failing cell. As a third example, compressed patterns may be converted to uncompressed patterns using an unroll process to try to reproduce failures. However, this can take significant time and may require maintaining a working uncompressed setup to match production compression patterns. Further, in some designs, scan cells in compression mode may not fully match scan cells in uncompressed modes. The techniques disclosed herein may avoid these problems and disadvantages.

Exemplary Failure Processing System and Procedures

Figure 2:
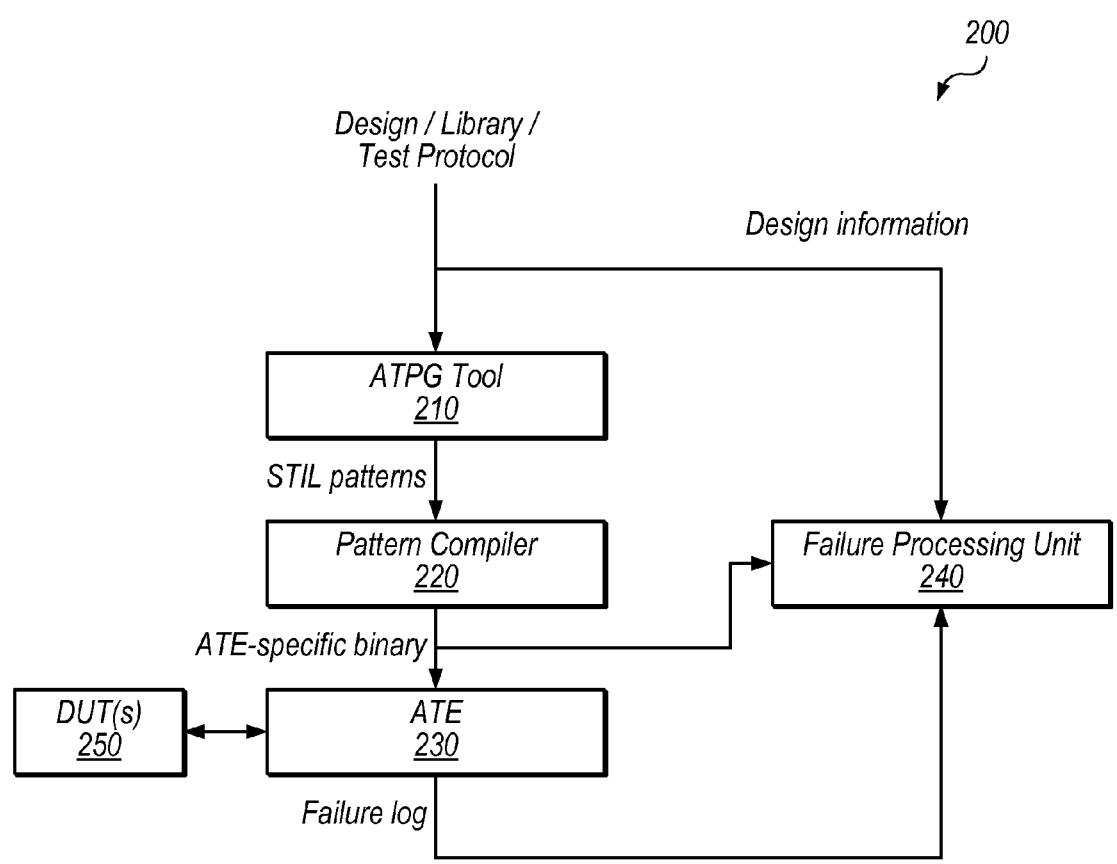
FIG. 2 is a flow diagram illustrating one embodiment of a method for processing failure information.

FIG. 2 shows a block diagram illustrating one embodiment of a system 200 configured to process failures for compressed scan testing. In the illustrated embodiment, system 200 includes ATPG tool 210, pattern compiler 220, ATE 230, and failure processing unit 240.

ATPG tool 210, in the illustrated embodiment, is configured to receive design, library, and/or test protocol information and generate test patterns. In the illustrated embodiment, the test patterns are standard test interface language (STIL) patterns, which are ATE platform independent. In various embodiments, the patterns are compressed input patterns. ATPG tool 210, in some embodiments, is also configured to generate expected test outputs.

Pattern compiler 220, in the illustrated embodiment, is configured to receive test patterns from ATPG tool 210 and compile the patterns to generate ATE-specific binary code usable by ATE 230. For example, pattern compiler 220 may be configured to add extra cycles to meet specific ATE requirements such as file size compression. In some embodiments, this may introduce discrepancies between the ATE-specific binary and the STIL patterns. In some embodiments, these discrepancies may be resolved by failure processing unit 240, e.g., based on the ATE-specific binary and the design information.

ATE 230, in the illustrated embodiment, is configured to perform one or more tests for DUT(s) 250 based on the ATE-specific binary. In the illustrated embodiment, ATE 230 is configured to generate one or more failure logs based on the testing.

Failure processing unit 240, in the illustrated embodiment, is configured to map failures to scan cells based on design information, the failure log, and a compiled scan pattern. In some embodiments, failure processing unit 240 includes one or more memories storing program instructions that are executable by one or more processors to perform any of the functionality described herein. In other embodiments, this functionality may be performed using dedicated hardware circuitry (e.g., an ASIC) or programmable hardware circuitry (e.g., a field programmable gate array). Failure processing unit 240 may be configured to cause various information to be displayed to a user and/or store logs of various information. In some embodiments, the inputs to failure processing unit 240 are all text files, allowing rapid mapping of failures to scan cells.

In some embodiments, the design information received by failure processing unit 240 indicates a compressor structure and a scan cell report. In one embodiment, this information is respectively included in an "SPF" file and an "RPT" file.

Design information may include various information such as, without limitation: scan chain information, pipeline stage information, scan chain to channel mapping, test protocol information, identification of scan cells in each chain in unload order, etc. In the illustrated embodiment, failure processing unit 240 is also configured to map failures based on an ATE failure log and the compiled pattern used on the ATE. This may allow failures to be mapped much more quickly in comparison with other approaches while resolving any inconsistencies introduced during compilation for a particular ATE. Failure processing unit 240 may also be easily configurable to process failures for multiple types of ATEs. However, X-masking may still result in difficulties for deterministically mapping failures to scan cells based on an initial test. Therefore, in some embodiments, failure processing unit 240 is configured to expand an input scan pattern to generate multiple compressed scan patterns that specify one-to-one modes in order to definitively determine a failing scan cell, even in the presence of X-masking.

Figure 3:
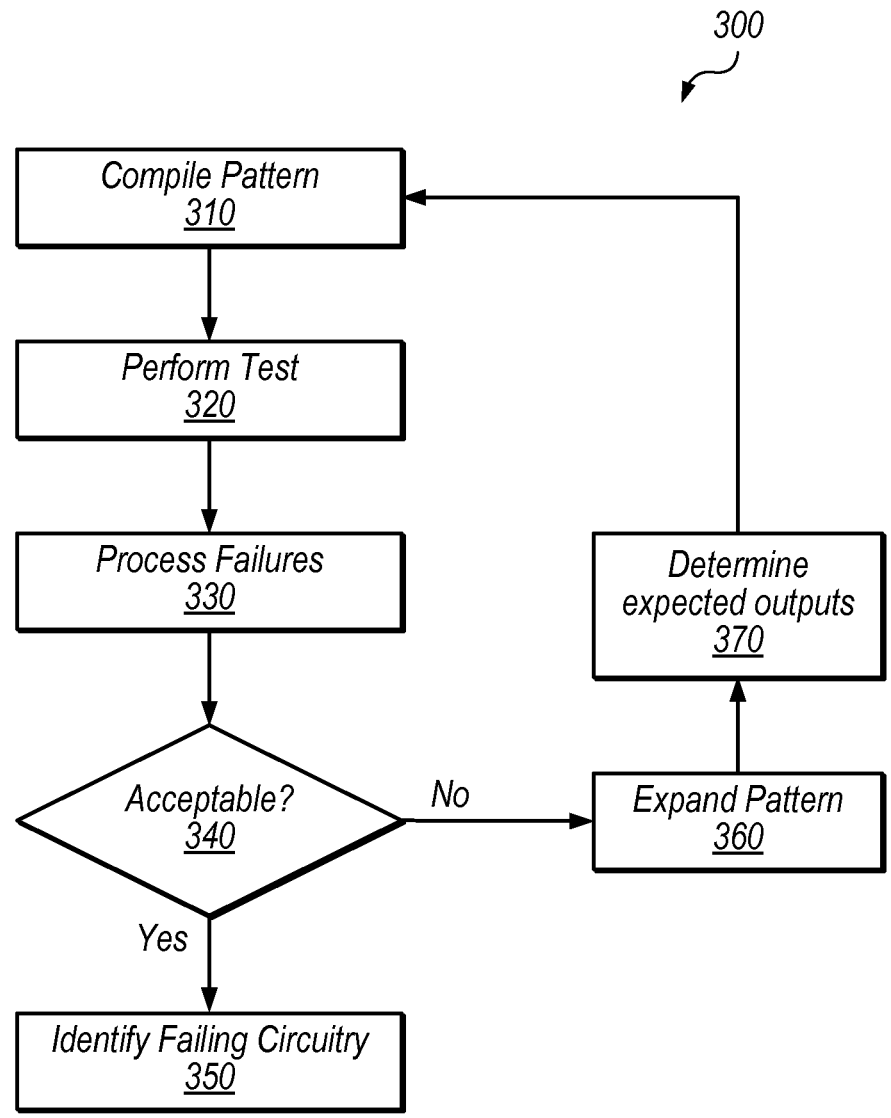
FIG. 3 is a flow diagram illustrating one embodiment of a method that includes generating test patterns that specify one-to-one modes.

FIG. 3 shows one embodiment of a method 300 for processing failures for compressed scan testing. In some embodiments, the method of FIG. 3 allows for definitive mapping of failures to a specific scan cell, even in the presence of X values. Said another way, from among a group of potentially failing cells for a given failure, the method of FIG. 3 may allow a definitive determination of a failing scan cell in the group. The method shown in FIG. 3 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at block 310.

At block 310, a test pattern is compiled. In some embodiments, the pattern is a STIL pattern and the compilation generates an ATE-specific output. Flow proceeds to block 320.

At block 320, a test is performed, e.g., using ATE 230. The test may involve providing scan inputs, decompressing scan inputs, shifting scan inputs through scan cells in a DUT, asserting clocking and/or capture signals, compacting scan chain output data, retrieving scan output data, etc. In some embodiments, the test generates one or more failure logs, e.g., based on mismatches between scan outputs and expected data. Flow proceeds to block 330.

At block 330, failures are processed. In one embodiment, failure processing unit 240 is configured to process one or more failure logs. In some embodiments, failure processing unit 240 is configured to receive design information and/or compilation information and map failures to scan cells based on the received information. Flow proceeds to decision block 340.

At decision block 340 it is determined whether the failure processing is acceptable. In one embodiment, processing is acceptable only if failing scan cell(s) are definitively determined. As used herein, a scan cell for a failure is "definitively determined" if the particular scan cell causing the failure is identified with 100% confidence. In contrast, if there are multiple potential failing scan cells for a given failure, e.g., due to X-masking, the potential failing scan cells are not definitively determined. In other embodiments, any of various metrics may be used for acceptability, e.g., threshold confidence values for probabilities that a particular scan cell caused a given failure. If the failure processing is acceptable, flow proceeds to block 350. Otherwise, flow proceeds to block 360.

At block 350, failing circuitry is identified. For example, failure processing unit 240 may be configured to output data indicating specific circuitry (e.g., flip-flops and/or latches) associated with each failure and/or a confidence level that the specific circuitry caused each failure. Failure processing unit 240 may be configured to cause this information to be displayed to a user and/or to be logged. Flow ends at block 350.

At block 360, the test pattern is expanded to generate multiple compressed input patterns that specify one-to-one modes. As used herein, the phrase "one-to-one mode" refers to a mode of operation in which at least one scan chain that is coupled to scan outputs via compactor circuitry is directly coupled to at least one scan output (i.e., such that other scan chain outputs are not XOR'd with the scan chain and the output of the scan chain controls the scan output, independent of other scan chains). In a one-to-one mode, failures for the directly-coupled scan chains are definitively mappable to failing scan cells. Typically, for a given one-to-one mode, some scan chains are directly coupled to scan outputs and other scan chains are not. However, a sufficient number of one-to-one modes are typically implemented in scan circuitry such that at least one one-to-one mode exists for each scan chain in which that scan chain is directly coupled to a scan output. In some embodiments, a one-to-one mode may be specified on a per-cycle basis. In these embodiments, a given shift may correspond to a one-to-one mode while a previous or subsequent shift may correspond to a full compactor (e.g., full XOR) mode.

In one embodiment, in block 360, compressed test patterns are generated for one-to-one modes for each scan chain identified as including a potentially failing scan cell. In various embodiments, the expanded test patterns result in the same stimulus (e.g., identical inputs) being applied to the scan cells as the original failing pattern, but using one-to-one modes instead of full XOR modes to unload the response.

In some embodiments, one-to-one modes are controlled using mode inputs. In some embodiments, load mode inputs indicate different routings from scan-in pins to scan chains. For example, in design with N scan-in pins and M scan chains, the N scan-in pins may broadcast data to the M scan chains in different ways based on load mode inputs.

In some embodiments, mode inputs indicate compactor masking (which may be used, e.g., to directly connect scan chains to scan outputs for one-to-one modes by masking other chains). These unload modes may be specified using scan inputs to the decompressor (e.g., some decompressor outputs may be send to the compactor rather than to scan chains) and/or directly provided to the compactor. These embodiments are discussed in further detail with reference to FIG. 5 below.

In some embodiments, an input (e.g., a particular pin) is used to indicate whether to operate in full compactor mode (e.g., in which all scan chain outputs are XOR'd normally) or in a one-to-one mode for a given cycle. In some embodiments, a STIL format pattern is used to generate the multiple one-to-one compressed input patterns based on the original stimulus. In other embodiments, a compiled pattern is used to generate the multiple one-to-one compressed input patters based on the original stimulus. Flow proceeds to block 370.

At block 370, expected outputs are determined for the patterns generated in block 360. The may involve re-simulating the patterns, for example, using an ATPG tool. Flow proceeds to block 310, in which the generated patterns are compiled and used to perform subsequent tests at block 320. In some embodiments, tests using the patterns generated at block 360 will always be acceptable at block 340, e.g., because they allow definitive determination of failing scan cells.

Figure 4:
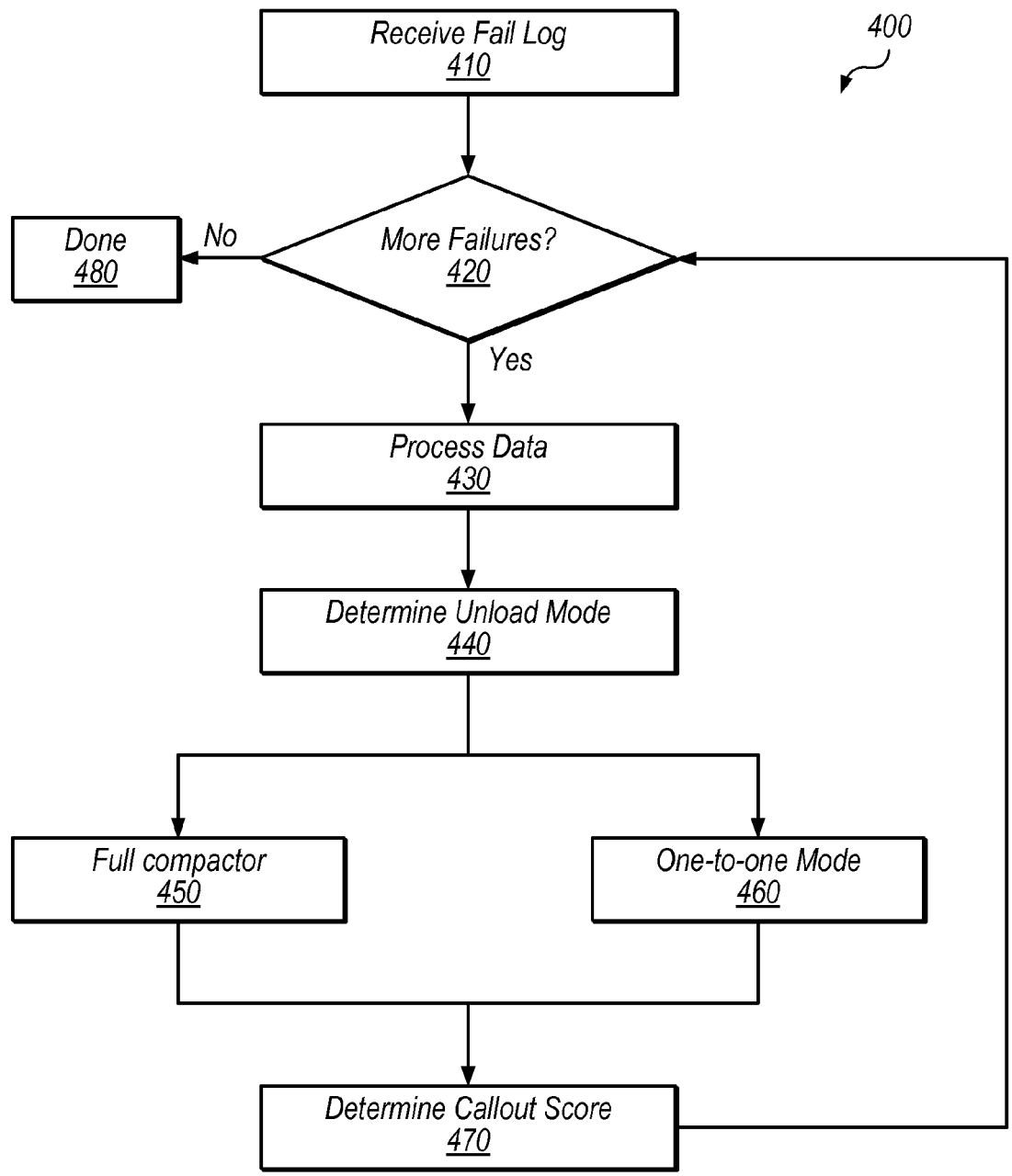
FIG. 4 is a flow diagram illustrating another embodiment of a method for processing failure information.
Figure 5:
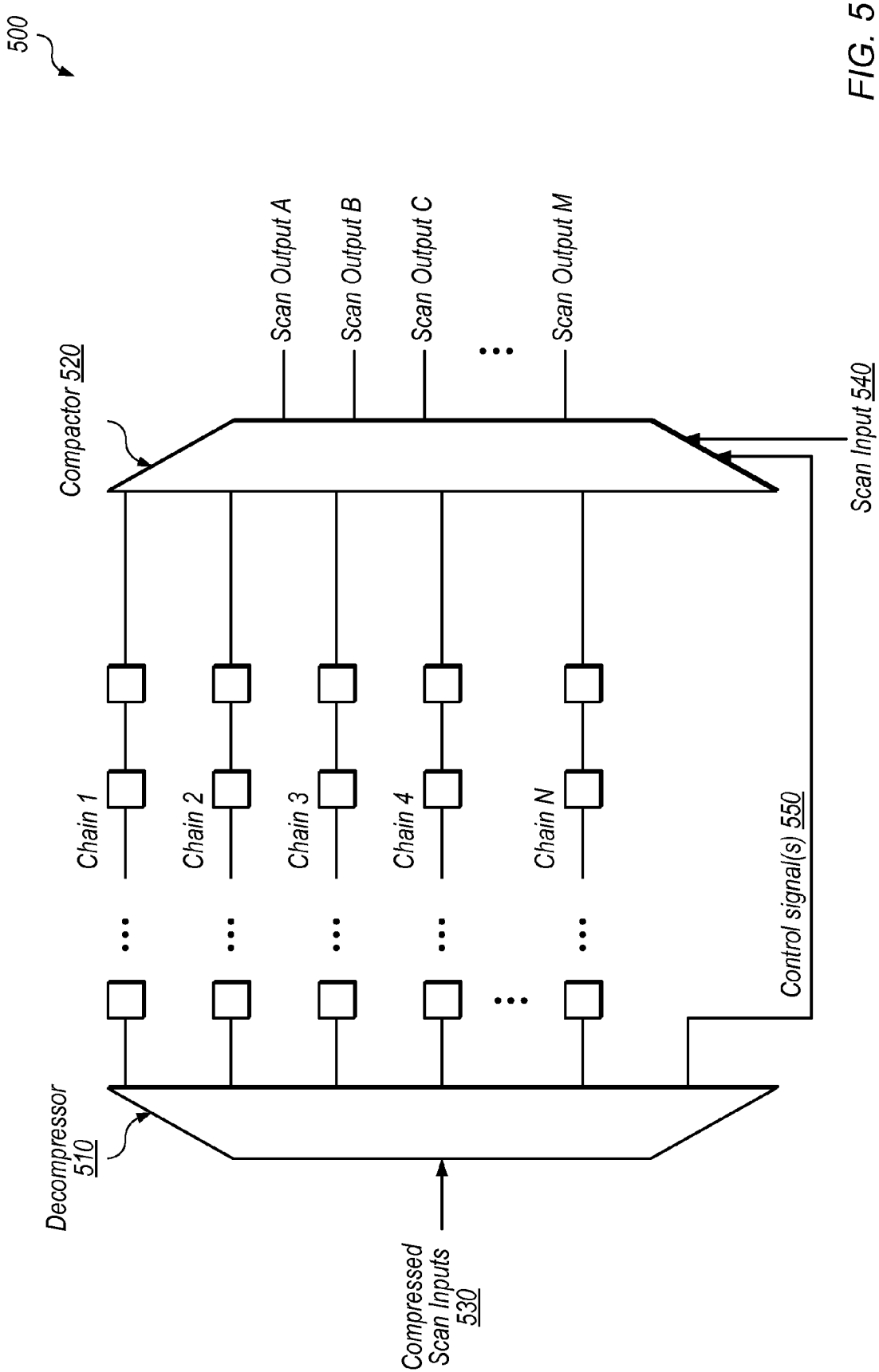
FIG. 5 is a block diagram illustrating one embodiment of compressed scan circuitry configured to implement one-to-one modes.

FIG. 4 is a flow diagram illustrating one embodiment of a method 400 for processing failure information. In some embodiments, the method of FIG. 4 is performed during block 330 of FIG. 3. The method shown in FIG. 4 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at block 410.

At block 410, a fail log is received, e.g., from ATE 230. Flow proceeds to decision block 420.

At decision block 420, it is determined whether there are more failures in the failure log. If not, flow proceeds to block 480 and ends. If there are more failures in the failure log, flow proceeds to block 430.

At block 430, input data is processed. The input data may include design information such as compressor structure and scan cell report information. The input data may also include compiled scan test information and the failure log. Flow proceeds to block 440.

At block 440, an unload mode is determined. This may be determined based on the compressed scan pattern, in some embodiments. If the unload mode is full compactor, flow proceeds to block 450. Otherwise, flow proceeds to block 460 for a particular one-to-one mode. Flow proceeds to block 470 via block 450 or block 460.

At block 470, callout score is determined. For example, in some embodiments, failure processing unit 240 is configured to indicate a degree of confidence that particular scan cells are failing scan cells. For example, if four cells are potentially failing cells, each may have a 25% confidence level. In some embodiments, the callout score is 100% for failures unloaded using an appropriate one-to-one mode and/or full XOR mode in the absence of X-masking Flow proceeds back to block 420. In some embodiments, the methods of FIGS. 3 and/or 4 are performed until each failure in a failure log is definitively mapped to a failing scan cell. In some embodiments, failure processing unit 240 is configured to report scan cells which capture incorrect response due to real manufacturing defects automatically (i.e., without human intervention). This may reduce testing time and cost, in some embodiments.

Exemplary Scan Test Circuitry Configured to Implement One-to-One Modes

FIG. 5 is a block diagram illustrating one embodiment of compressed scan circuitry 500 configured to implement one-to-one modes. In the illustrated embodiment, circuitry 500 includes decompressor 510, compactor 520, and scan chains 1-N. In various embodiments, any of various appropriate numbers of compressed scan inputs 530, scan chains 1-N, and/or scan outputs A-M may be included in circuitry 500. Circuitry 500 may be included in a DUT in some embodiments.

In the illustrated embodiment, decompressor 510 is configured to decompress compressed scan inputs 530. In the illustrated embodiment, this includes generating control signal(s) 550 for compactor 520. Thus, in the illustrated embodiment, some outputs of decompressor 510 are used as control signals for unload modes rather than being provided to scan chains 1-N. In the illustrated embodiment, scan input 540 is also provided to compactor 520 as a control signal (e.g., directly from an input pin rather than being compressed). In various embodiments, one or more control signals for a compactor may be generated by a decompressor and/or provided directly to scan input pins. In some embodiments, routing of scan inputs to scan chains may also be controlled based on one or more compressed scan inputs 530. Thus, a given compressed scan pattern may provide: data to be shifted through scan chains, control information used to route data to particular scan chains for different load modes, and/or control information used to determine unload modes (e.g., different one-to-one modes or full compactor mode).

Compactor 520, in the illustrated embodiment, is configured to implement a plurality of one-to-one modes. In the illustrated embodiment, one of the one-to-one modes or a full compactor mode may be selected using control signal(s) 550 and/or scan input 540. For example, in one of the one-to-one modes, the output of scan chain 1 may be directly coupled to scan output B (i.e., such that other scan chains are not XOR'd with the output of scan chain 1 to generate scan output B). This may allow a definitive determination whether a scan cell in chain 1 is the failing cell for a particular failure, even in the presence of X values from other scan chains. In various embodiments, various numbers of control signals may be provided to compactor 520 to implement various appropriate numbers of one-to-one modes. In some embodiments, compactor 520 is configured to implement a sufficient number of one-to-one modes such that each scan chain is directly coupled to a scan output in at least one of the one-to-one modes. In some embodiments, compactor 520 is configured to implement different one-to-one modes for different shift cycles of a given test. In some embodiments, compactor 520 is configured similarly to compactor 120 as described above with reference to FIG. 1.

In some embodiments, to generate an input pattern for a given one-to-one mode, failure processing unit is configured to generate two data streams from a stimulus for a failing pattern for which a failing scan cell cannot be definitively determined. In these embodiments, the first data stream is the original stimulus data such that the values propagated through the scan cells are the same as for the failed test. In these embodiments, the second data stream includes data that specifies the desired one-to-one mode for a given scan chain, e.g., by controlling decompressor 510 and/or compactor 520.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
receiving failure information from a first test of a device under test (DUT) performed using automatic test equipment (ATE), wherein the DUT includes a plurality of scan chains that each include a plurality of scan cells and wherein the first test is based on a first compressed test pattern;
determining that the failure information is usable to identify a group of scan cells as scan cells that have potentially failed the first test, but the failure information does not permit a definitive determination as to whether a scan cell in the group is a failing scan cell;
in response to the determining, generating, based on the first compressed test pattern, a plurality of compressed test patterns, wherein ones of the plurality of compressed test patterns specify respective modes in which ones of the plurality of scan chains directly control a scan output independent of other ones of the scan chains, wherein the ones of the plurality of scan chains correspond to ones of the group of scan cells;
performing one or more second tests of the DUT using the ATE and the plurality of compressed test patterns; and
definitively determining one or more scan cells in the group as failing scan cells based on failure information from the one or more second tests.

2. The method of claim 1, further comprising:
receiving design information for the DUT, wherein the determining and the definitively determining are based on design information.

3. The method of claim 2, wherein the design information includes a scan cell report and compressor structure information.

4. The method of claim 2, wherein the first compressed test pattern is generated by an automatic test pattern generator (ATPG) based on the design information.

5. The method of claim 2, further comprising:
receiving compilation information for the first compressed test pattern and the plurality of compressed test patterns, wherein the determining and the definitively determining are based on compilation information.

6. The method of claim 1, further comprising:
compiling the plurality of compressed test patterns for the ATE prior to performing the one or more second tests; and
simulating the plurality of compressed test patterns to generate expected outputs prior to performing the one or more second tests.

7. The method of claim 1, further comprising:
decompressing the plurality of compressed test patterns to generate control signals for compactor circuitry to implement the respective modes.

8. The method of claim 1, wherein performing each of the first test and the second one or more tests includes:
providing a compressed test pattern to input pins;
decompressing the compressed test pattern;
shifting the decompressed test pattern via the plurality of scan chains;
asserting capture signals;
compacting scan chain outputs; and
reading scan outputs values.

9. The method of claim 1, wherein the failure information does not permit a definitive determination as to whether a scan cell in the group is a failing scan cell because of one or more unknown design values.

10. A non-transitory computer-readable medium having instructions stored thereon that are executable by a computing device to perform operations comprising:
receiving failure information from a first test of a device under test (DUT), wherein the DUT includes a plurality of scan chains that each include a plurality of scan cells and wherein the first test is based on a first compressed test pattern;
determining that the failure information is not usable to definitively determine a failing scan cell for a failure because of an unknown value for the first test;
generating a plurality of compressed test patterns that specify identical input values for the plurality of scan chains as the first compressed test pattern, wherein the plurality of compressed test patterns specify test modes in which an output of at least one scan chain of the plurality of scan chains directly controls a scan output independent of other ones of the plurality of scan chains; and
definitively determining the failing scan cell for the failure based on failure information from one or more second tests of the DUT, wherein the one or more second tests of the DUT are performed using the plurality of compressed test patterns.

11. The non-transitory computer-readable medium of claim 10, wherein the operations further comprise:
causing the one or more second tests of the DUT to be performed.

12. The non-transitory computer-readable medium of claim 10, wherein the operations further comprise:
receiving design information for the DUT, wherein the determining and the definitively determining are based on the design information.

13. The non-transitory computer-readable medium of claim 12, wherein the operations further comprise:
receiving compilation information for the plurality of compressed test patterns, wherein the determining is based on the compilation information.

14. The non-transitory computer-readable medium of claim 10, wherein the operations further comprise:
compiling the plurality of compressed test patterns for automatic test equipment; and
generating expected outputs for the plurality of compressed test patterns.

15. The non-transitory computer-readable medium of claim 10, wherein the operations further comprise:
generating control signals for compactor circuitry for the test modes.

16. A system, comprising:
a failure processing unit, configured to:
receive failure information from a first test of a device under test (DUT), wherein the DUT includes a plurality of scan chains that each include a plurality of scan cells and wherein the first test is performed using a first compressed test pattern;
determine that the failure information is not usable to definitively determine a failing scan cell for a failure;
generate a plurality of compressed test patterns based on the first test pattern, wherein the plurality of compressed test patterns specify different test modes in which an output of at least one scan chain of the plurality of scan chains directly controls a scan output independent of other ones of the plurality of scan chains; and
definitively determine the failing scan cell for the failure based on one or more second tests of the DUT using the plurality of compressed test patterns.

17. The system of claim 16, further comprising:
automatic test equipment configured to perform the first test and the one or more second tests of the DUT.

18. The system of claim 16, wherein the failure processing unit is further configured to:
receive design information for the DUT, wherein the definitive determination of the failing scan cell for the failure is based on the design information.

19. The system of claim 18, further comprising:
an automatic test pattern generator configured to generate the first compressed test pattern.

20. The system of claim 16, further comprising:
a compiler unit configured to compile the plurality of compressed test patterns; and
a simulation unit configured to determine expected outputs for the plurality of compressed test patterns.

* * * * *